(12) United States Patent
Domes (10) Patent No.: US 8,729,914 B2
(45) Date of Patent: May 20, 2014

(54) DETECTION OF THE CONDUCTION STATE OF AN RC-IGBT

(75) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 719 days.

(21) Appl. No.: 12/943,079

(22) Filed: Nov. 10, 2010

(65) Prior Publication Data

US 2012/0112775 A1    May 10, 2012

(51) Int. Cl.
  *G01R 19/14*    (2006.01)
(52) U.S. Cl.
  USPC ........................................................ 324/686
(58) Field of Classification Search
  None
  See application file for complete search history.

(56) References Cited

U.S. PATENT DOCUMENTS

| 4,841,166 A * | 6/1989 | Harnden ...................... 327/110 |
| 2003/0179021 A1 | 9/2003 | Braun et al. |
| 2010/0079192 A1 * | 4/2010 | Strzalkowski ................ 327/419 |

FOREIGN PATENT DOCUMENTS

| DE | 10212869 A1 | 9/2003 |
| DE | 102006025374 A1 | 12/2007 |
| DE | 102009001029 A1 | 8/2010 |
| WO | 2007/137569 A1 | 12/2007 |

* cited by examiner

*Primary Examiner* — Tung X Nguyen
(74) *Attorney, Agent, or Firm* — Murphy, Bilak & Homiller, PLLC (57) ABSTRACT

A circuit arrangement includes: a reverse conducting IGBT configured to allow for conducting a load current in a forward direction and in a reverse direction, the IGBT having a load current path and a gate electrode; a gate control unit connected to the gate electrode and configured to activate or deactivate the IGBT by charging or, respectively, discharging the gate electrode in accordance with a gate control signal; a gate driver unit configured to detect whether the IGBT conducts current in the forward direction or the reverse direction by sensing a gate current caused by a change of a voltage drop across the load path due to a changing of the reverse conducting IGBT into its reverse conducting state, the gate control unit further configured to deactivate the IGBT or to prevent an activation of the IGBT via its gate electrode when the gate driver unit detects that the IGBT is in its reverse conducting state.

17 Claims, 4 Drawing Sheets

| state | control or trigger signals | | output potential $V_{OUT}$ / conducting state of IGBT | | | |
|---|---|---|---|---|---|---|
| | $S_{1TOP}$ | $S_{1BOT}$ | $i_{OUT} < 0$ | | $i_{OUT} > 0$ | |
| I | 0 | 0 | $V_{EE}$ | reverse | $V_{CC}$ | reverse |
| II | 0 | 1 | $V_{EE}$ | reverse | $V_{EE}$ | forward |
| III | 1 | 0 | $V_{CC}$ | forward | $V_{CC}$ | reverse |
| IV | 1 | 1 | prohibited (half-bridge short circuit) | | | |

DETECTION OF THE CONDUCTION STATE OF AN RC-IGBT

TECHNICAL FIELD

The present disclosure relates to a method for controlling a reverse conducting insulated gate bipolar transistor (RC-IGBT), particularly to a method for detecting the direction of a current passing through the RC-IGBT.

BACKGROUND

Conventional IGBTs are used, for example, in conventional inverter circuits to regulate inductive loads related to an electric machine. The conventional inverter circuits include conventional IGBTs, each connected in parallel to a free-wheeling diode to allow for a bi-directional current, which becomes necessary, if IGBTs are to be applied, for example, in connection with electric machinery implicating inductive load characteristics. The application of parallel free-wheeling diodes, however, involves numerous disadvantages, i.e.: The IGBT housing is to be designed so as to accommodate both, the IGBT body and the separate free-wheeling diode alike, and the bonding of the two components is a comparatively complex and costly matter.

To avoid these disadvantages, reverse conducting IGBTs (so called RC-IGBTs) have become popular, such as disclosed in the U.S. Patent Publication No. 2007/0231973 A1, in which an IGBT and a free-wheeling diode are monolithically formed as one simple semiconductor component. The p-doped collector zone is locally disrupted by incisions, where n-doped semiconductor material contacts the collector metallization, resulting in a so-called PIN-electrode structure between the emitter structure, the lightly doped drift zone and the p-doped material in the MOS-channel zone.

The conducting state of a conventional free-wheeling diode connected antiparallel to an IGBT does not depend on the conducting state of the IGBT, whereas the intrinsic free-wheeling diode of an RC-IGBT is influenced by the conduction state of the MOS-channel zone of the RC-IGBT. That is, if the RC-IGBT is triggered via its gate electrode during its reverse conduction state, the MOS-channel is conductive. Since the MOS-channel allows for a bi-directional current, electrons in the reverse conduction path will see an additional current path in case of a triggered gate electrode. Such, the forward voltage drop may be substantially increased in the PIN-diode structure as not all of the electrons contribute to the flooding of the PIN-diode, which is undesirable in most cases.

Publication DE 10 2009 001 029 A1 teaches a control method and a corresponding circuit structure, how to overcome the problem described hereinbefore, the control method involving a method for detecting the current direction in an RC-IGBT. The current direction is particularly detected by means of a commonly used $V_{CEsat}$-detection circuitry, $V_{CEsat}$ representing the collector-emitter saturation voltage of the RC-IGBT. One disadvantage about the $V_{CEsat}$-detection circuitry may be that at least one (or a plurality of serial) diode(s) of high blocking capability is necessary, these diodes being comparatively costly on the one hand, and, on the other hand, they have a large space within a power electronic arrangement due to the required electric creepage distances.

There is a need to overcome or at least to alleviate the problems discussed above. Further, there is a need to provide a circuit arrangement and a corresponding method to prevent the RC-IGBT from being switched on via its gate electrode while being in its reverse conducting state.

SUMMARY

A circuit arrangement is disclosed. In accordance with one embodiment, the circuit arrangement includes: a reverse conducting IGBT configured to allow for conducting load current in a forward direction and in a reverse direction, the IGBT having a load current path and a gate electrode; a gate control unit coupled to the gate electrode and configured to activate or deactivate the IGBT by charging or, respectively, discharging the gate electrode in accordance with a gate control signal; a monitoring unit configured to detect whether the IGBT conducts current in the reverse direction by sensing a gate current caused by a change of a voltage drop across the load path due to a changing of the reverse conducting IGBT into its reverse conducting state, wherein the gate control unit is further configured to deactivate the IGBT or to prevent an activation of the IGBT when the monitoring unit detects that the IGBT is in its reverse conducting state.

Further, a method is disclosed for detecting whether an IGBT is in a forward conducting state or in a reverse conducting state. In accordance with one embodiment, the method includes: providing a reverse conducting state having a load path; and sensing a gate current caused by a change of a voltage drop across the load path due to a changing of the reverse conducting IGBT into its reverse conducting state.

The circuit arrangement and the method according to the present invention may also be used for any field-effect transistor and is not limited to IGBTs.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Insulated gate field effect transistors (IGBTs) usually are operated having a free-wheeling diode connected anti-parallel to their load current paths. Dependent on the load current direction and the IGBT gate signal, such a parallel circuit of IGBTs and diode may be in a forward conducting state, in a reverse conducting state or in an in forward blocking state. In the present example, the load current direction is essentially determined by the state of an inductive load. The forward current flows through the load current path (collector-emitter-path) of the IGBT and the reverse current flows through the diode. During reverse conduction, the conducting state of the diode is not influenced by the IGBTs regardless of whether the gate of the IGBT is actively driven to a high level or a low level.

So-called reverse conducting IGBTs (RC-IGBTs) have an intrinsic reverse diode such that no separate free-wheeling diode is required. However, the conduction behaviour of the intrinsic reverse diode heavily depends on whether the gate of the RC-IGBT is actively driven to a high level or a low level.

In RC-IGBTs the reverse voltage drop across the intrinsic reverse diode increases to undesired high levels if the IGBT gate is driven to a high level. The reverse voltage can thereby be regarded as the anode-cathode voltage across the load path of the internal free-wheeling diode.

Figure 1:
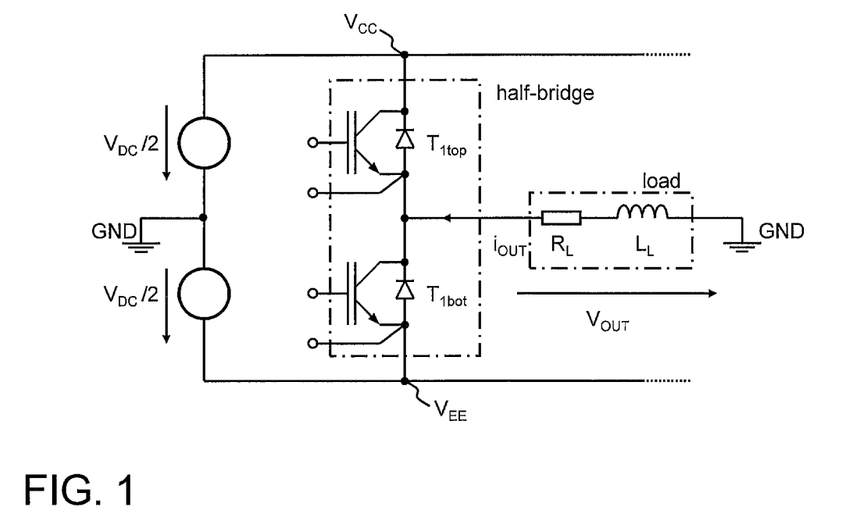
FIG. 1 illustrates an IGBT half-bridge circuit connected to a load impedance including an inductor.

RC-IGBTs are commonly used in (power) converters, wherein an IGBT half-bridge is used to control each phase-current. FIG. 1 schematically illustrates such a half-bridge. The IGBT half-bridge may include two n-channel IGBTs $T_{1TOP}$, $T_{1BOT}$ connected in series. An operating voltage $V_{DC}$ (intermediate voltage or DC-link voltage) is applied across the half bridge, i.e. between the collector of the high-side transistor $T1_{TOP}$ and the emitter of the low-side transistor $T_{1BOT}$. The collector potential of the high-side transistor $T_{1TOP}$ is referred to herein as $V_{CC}$, whereas the emitter potential of the bottom transistor $T_{1BOT}$ is referred to herein as $V_{EE}$. The common circuit node of $T_{1TOP}$ and $T_{1BOT}$ is the output node of the half-bridge that provides the output current $i_{OUT}$ (also called phase-current) to a connected load impedance. In most cases the load impedance includes an inductive load. Commonly, the DC link voltage is symmetrical with respect to a reference potential GND, i.e. $V_{CC}=V_{DC}/2$ and $V_{EE}=-V_{DC}/2$. In the present case, the load is connected between the output of the half-bridge and the reference potential GND.

Figure 4:
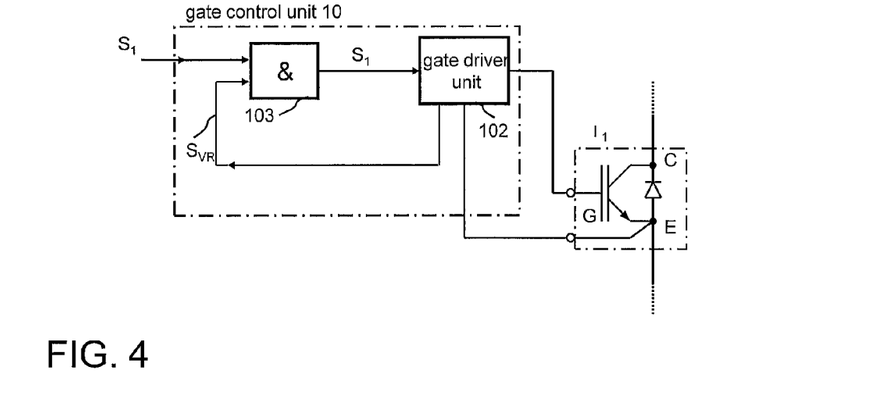
FIG. 4 illustrates an IGBT with a gate control unit monitoring the conducting state of the corresponding IGBT and switching the transistor depending on its conducting state.

A gate control unit 10 is provided for each transistor $T_{1TOP}$, $T_{1BOT}$ to control the output current $i_{OUT}$ (half-bridge output current). The gate control unit 10 may include a gate driver unit 102 as shown in FIG. 4 which is described later herein, which may be configured to achieve a certain time response of the current $i_{OUT}$ (i.e. edge-shaped current steps) and/or to prevent the half-bridge from being short-circuited. Both of the gate control units 10 are provided with a (binary) gate control signal $S_{1TOP}$ and $S_{1BOT}$, each indicating the desired conduction state of the corresponding transistor $T_{1TOP}$ or $T_{1BOT}$. A converter half-bridge including gate control units 10 is illustrated in FIG. 2.

Figure 2:
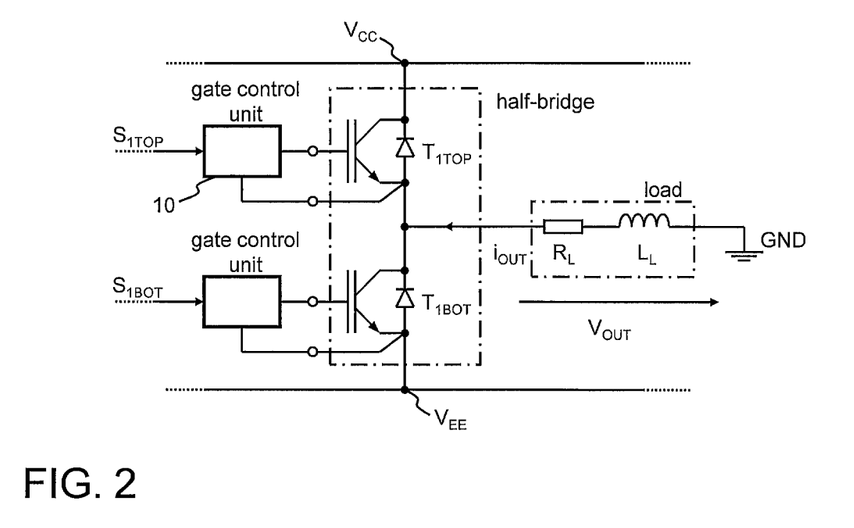
FIG. 2 illustrates the IGBT half-bridge of FIG. 1 including a gate control unit for each transistor.
Figure 3:
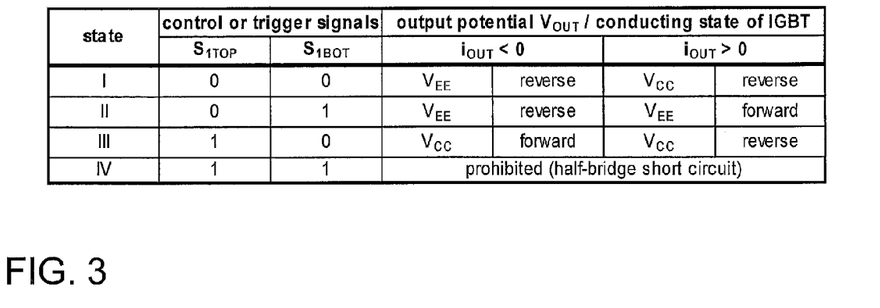
FIG. 3 illustrates a table listing the conducting states of the half-bridge IGBTs of FIG. 2 in dependence on the load current direction of the corresponding IGBT.

FIG. 3 illustrates the four possible switching states of a half-bridge, e.g. the half-bridge illustrated in FIG. 2. Depending on the control signals $S_{1TOP}$ and $S_{1BOT}$ and the direction of the output current $i_{OUT}$ (load current), which may be determined by an inductive load, the output potential of the half-bridge output node takes either (approximately) the value $V_{EE}=-V_{DC}/2$ or $V_{CC}=V_{DC}/2$.

Referring to FIG. 3, in switching state I both RC-IGBT control signals $S_{1TOP}$, $S_{1BOT}$ drive the corresponding transistor to its off state. Thus, the output current $i_{OUT}$ can only flow through the intrinsic reverse diode of either the transistor $T_{1TOP}$ or the transistor $T_{1BOT}$ in accordance with the direction of the output current $i_{OUT}$. That is, the output current $i_{OUT}$ either flows through the intrinsic free-wheeling diode of the top transistor $T_{1TOP}$ or through the free-wheeling diode of bottom transistor. Consequently, the output potential is either $V_{EE}$ (in case of a negative output current $i_{OUT}$) or $V_{CC}$ (in case of a positive output phase current $i_{OUT}$), this being a mere approximation as the forward voltage drop of the intrinsic diode is neglected in the above consideration.

Again referring to FIG. 3, in switching state II only the transistor $T_{1BOT}$ is driven so as to assume its conducting state (i.e. $S_{1BOT}=1$, $S_{1TOP}=0$), also called the on-state. Thus, independent of the direction of the output current $i_{OUT}$, the output potential is approximately equal to $V_{EE}$. In case of a positive output current $i_{OUT}$ (a positive current flows in the direction as indicated in FIG. 2 by the arrow referring to $i_{OUT}$) the transistor $T_{1BOT}$ is in its forward conducting state, whereas, in case of a negative output current, $T_{1BOT}$ is in its reverse conducting state. Switching state III, is complementary to state II.

State IV refers to a state in which both transistors $T_{1BOT}$ and $T_{1TOP}$ are driven into their forward conducting states (i.e. $S_{1TOP}=S_{1BOT}=1$). However, in such a state the DC link voltage $V_{DC}$ would be short-circuited, which may result in malfunctions or even in the destruction of the half-bridge. The gate driver circuit should therefore be configured to prevent such a half-bridge shoot-through.

In switching states II and III the above-mentioned problem may occur, when a transistor is activated (i.e. $S_{1TOP}=1$ or, respectively, $S_{1BOT}=1$) while being in the reverse conducting state. In this case the voltage drop across its load-path would considerably increase, which would inevitably result in increased losses and consequently in significant heat generation. More precisely, the problem may occur in state II in case of a negative output current $i_{OUT}$, and in state III in case of a positive output current $i_{OUT}$.

The problem might be solved or at least alleviated by a circuit arrangement built in accordance to one example of the present invention. FIG. 4 illustrates a circuit arrangement that includes a reverse conducting IGBT $T_1$ capable of conducting via its load path, a load current in forward direction (via a MOS channel) as well as in reverse direction (via the intrinsic anti-parallel reverse diode).

Transistor $T_1$ includes a gate electrode G connected to a gate control unit 10, that drives the forward current path of the IGBT on and off in accordance with a corresponding control signal $S_1$. The gate control unit 10 includes a gate driver unit 102 coupled to the gate electrode G, the gate control unit 10 being configured to supply appropriate gate driver signals to the gate G in accordance with the control signal $S_1$, thus switching the forward current path of the transistor into an on-state or an off-state.

The gate driver signal supplied to the gate electrode G may be a suitable gate-emitter voltage $V_{GE}$ or a gate current $i_{GATE}$, depending on whether the transistor $T_1$ is to be current-driven or voltage-driven.

There are numerous alternatives as to how the signal $S_1$ may be blocked or blanked so as to prevent a switch-on of the transistor T1 even when $S_1$ is at a high-level. For example, the signal $S_1$ is passed through an AND-gate 103 before being admitted to the gate driver unit 102 which generates the gate control signal. A current direction signal $S_{VR}$ is generated by the gate driver unit 102 and further components described later herein and applied to an input of the AND-gate 103. Assuming that $S_{VR}=0$, if the transistor $T_1$ is in its reverse conducting state, the signal $S_1$ will be blanked before reaching the gate driver unit 102. Thus, the signal $S_1$ is prevented from activating the transistor $T_1$ while the transistor is in its reverse conducting state. Further assuming that $S_{VR}=1$, if the transistor is not in its reverse conducting state (on-state or blocked), the signal $S_1$ is not blanked and is passed on to the gate driver unit 102, which may then generate an appropriate gate driver signal switching the transistor to its on-state.

Figure 5:
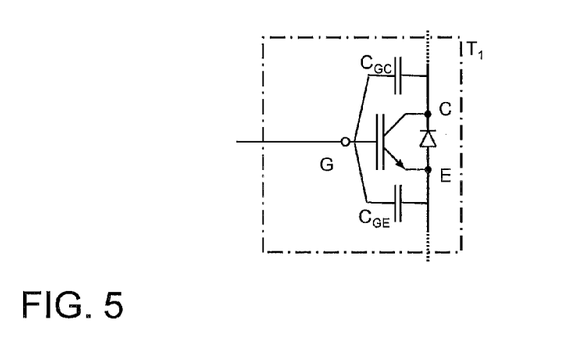
FIG. 5 illustrates the dominant parasitic input capacitances related to an RC-IGBT.

Parasitic capacitances are treated as inherent to every electronic switch, thus also inherent to an RC-IGBT as used in the example introduced in FIGS. 1 to 4. The gate-collector capacitance $C_{GC}$ and gate-emitter capacitance $C_{GE}$ are illustrated in the circuit diagram of FIG. 5. However, as compared to the gate-collector capacitance $C_{GC}$ the gate-emitter capacitance $C_{GE}$ can be neglected in the following considerations. To charge and discharge the mentioned capacitances, in particular the gate-collector capacitance $C_{GC}$, a gate current $i_{GATE}$ has to flow into the gate electrode G or, respectively, originate therefrom. The capacitance $C_{GC}$ is charged or discharged upon a change of the direction of the voltage drop across the load path (collector-emitter path) of the RC-IGBT. The change of the direction of the voltage drop is caused by a change of the load current of the respective IGBT. The charging of the capacitance $C_{GC}$ implies a displacement current resulting in a corresponding gate current $i_G$ which the present invention may utilize to determine the conduction state of the corresponding RC-IGBT.

Figure 6:
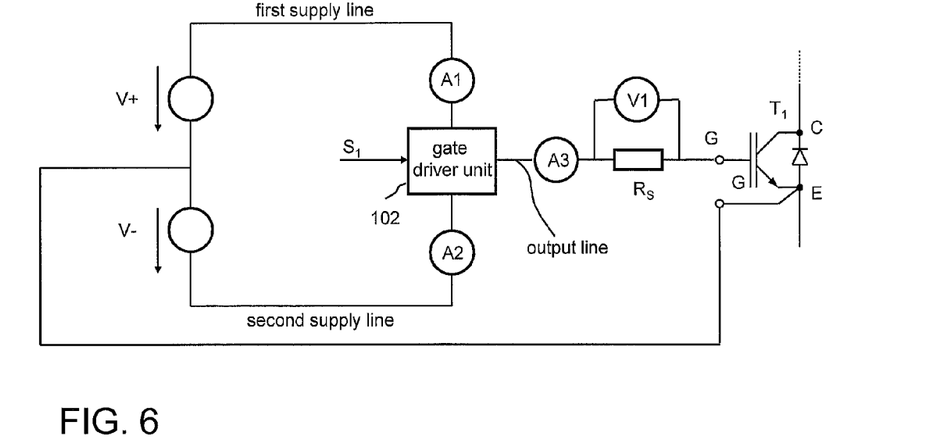
FIG. 6 illustrates a variety of options for gate current sensing using a gate driver circuit.

In order to attain the conducting state signal $S_{VR}$, the gate driver unit 102 can sense the gate current flowing to and from the gate electrode G of the RC-IGBT. FIG. 6 shows an embodiment in accordance with the present invention. Current-measuring devices, for example appropriate ampere meters, are arranged in the first supply line of the gate driver (device A1), and/or in the second supply line (device A2), and/or in the gate driver output line (device A3), the gate driver output line being sometimes referred to as 'gate wire' in common literature. Conceivably, also two or more of the three current-measuring devices may be arranged in the circuitry according to the invention. Alternatively, though, only one of the three current measuring devices may be sufficient in many applications.

In accordance with the example illustrated in FIG. 6, a shunt resistance $R_S$ may be connected as current measuring device between the gate driver unit 102 and the gate electrode of the connected transistor $T_1$ (i.e. the gate resistor is inserted in the gate driver output line). In this case, a parallel voltage-measuring device V1 may serve to sense the gate current in accordance with one example of the present invention. It is possible to combine one or more than one of the current-measuring devices or methods for gate current sensing described herein. In accordance with another example of the present invention, a shunt resistance is arranged in the first (high side) and/or in the second (low side) supply line supplying the gate driver unit 102. Again, the voltage drop across the shunt resistor may be measured, thus obtaining a measurement value representative of the gate current.

It is to be noted that a resistance is commonly arranged between the gate G and the output of the gate driver 102. This resistance, usually referred to as gate resistance $R_G$ (not shown), could also be used as shunt resistor for current sensing instead of an additional shunt resistance $R_S$. It is noted that any combination of current-measuring devices and shunt (or gate) resistances may be employed in accordance with examples of the present invention, even if not explicitly referred to herein.

Still referring to FIG. 6, the gate driver unit 102 is shown to be supplied by a voltage source (V+, V−). A current sensing device A1 or A2 may be inserted in the supply lines providing current to the gate driver unit 102. A signal representative of the gate current might be sensed at various positions in gate control circuit 10. Further, current sensing may be performed at more than one position in the same circuitry.

Figure 7:
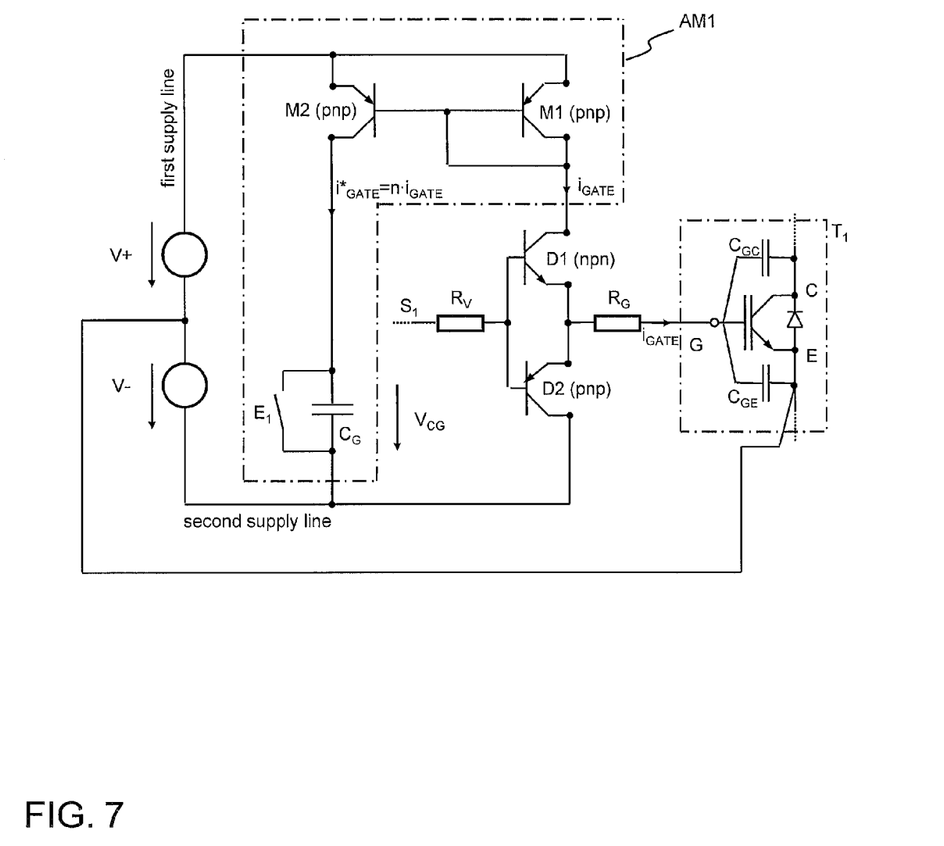
FIG. 7 illustrates one advantageous circuit arrangement for gate current sensing by means of a current mirror connected to a gate driver circuit.

FIG. 7 illustrates one particular implementation of the current-measuring device A1 of FIG. 6. Further, some details of the gate driver unit 102 are illustrated in FIG. 7. The gate control signal $S_1$ (if not blanked) is provided to the gate electrodes of an emitter follower stage across a series resistance $R_V$. The emitter follower stage (output stage), for example, can be formed by bipolar transistors $D_1$ (which may be an npn transistor) and bipolar transistor $D_2$ (which may be a pnp transistor). Instead of bipolar transistors, any transistor type (i.e. MOSFETs) may be applied for implementation of the emitter follower stage. The emitter follower stage provides the gate current $i_{GATE}$ to the RC-IGBT $T_1$ across the gate driver output line (or gate wire). For the purpose of switching speed control (e.g. "edge shaping"), in most cases a gate resistance $R_G$ is placed in the gate wire.

As shown in FIG. 7, the current measuring device may comprise a current mirror which is formed by the transistors $M_1$ and $M_2$. A capacitor $C_G$ and an electronic switch $E_1$ (i.e. another transistor) connected parallel thereto are coupled to the current mirror such that the mirror current may charge the capacitor $C_G$. The current mirror provides a first current path across $M_1$ and a second current path across $M_2$. The first current path preferably carries the gate current $i_{GATE}$, whereas the second current path carries a mirror current $i_{GATE}^* = n \cdot i_{GATE}$ (where n is usually lower or equal than 1) which is equal or directly proportional to the gate current $i_{GATE}$. Both the gate current $i_{GATE}$ and the mirror current $i_{GATE}^*$ may be provided by the voltage sources V+ and V−.

As described hereinbefore, it is the nature of an RC-IGBT $T_1$ that, upon a sudden change in the voltage drop across its collector-emitter path (e.g. a $V_{CE}$ voltage dip), the intrinsic parasitic capacitance $C_{GC}$ (and $C_{GE}$) will be charged or discharged, resulting in a corresponding gate current $i_{GATE}$. A discharging of the parasitic gate-collector capacitance $C_{GC}$ is particularly caused by a collector-emitter voltage ($V_{CE}$) dip of a transistor presently passing from a forward blocking into its reverse conducting state. The voltage dip results in a displacement current and respective gate current which can be measured in the gate wire (gate supply line). If a gate current $i_{GATE}$ passes through the transistor $M_1$, it is mirrored by the current mirror such that the sense capacitance $C_G$ will "see" a change of its charge state resulting from the mirror current $i_{GATE}^*$. The switch $E_1$ may be used to short-circuit and discharge the capacitance $C_G$. The charge $Q_G$ stored in the capacitance $C_G$ is monitored appropriately using the relation $Q_G = C_G \cdot V_{CG}$, i.e. by measuring the voltage drop $V_{CG}$ across $C_G$. The value of $C_G$ is chosen appropriately according to the relation between the currents $i_{GATE}$ and $i_{GATE}^*$. Thus, the charge stored in capacitor $C_G$ is a measure for the gate current $i_{GATE}$, the gate current again being a measure for the conducting state of the RC-IGBT. A circuit arrangement, particularly a gate driver circuit, as depicted in FIG. 7 for an RC-IGBT $T_1$, is provided for each RC-IGBT of an inverter half-bridge (as shown in FIG. 1). A detailed description of how the conducting state of the RC-IGBT may be derived from the gate current $i_{GATE}$, that is from the state of charge of the capacitance $C_G$, is given next.

Considering switch $E_1$, the capacitor $C_G$ is charged by $i_{GATE}^*$ as long as $E_1$ is open. If $E_1$ is closed, capacitor $C_G$ will be discharged and a measurement cycle thus initialized. According to embodiment, the switch $E_1$ may be switched synchronously with the gate control signal $S_1$ of the corresponding RC-IGBT. The switch $E_1$ resets the charge state (i.e. initializing step) of the sense capacitance $C_G$ prior to the initiation of the sense period, the sense period being the time interval while the RC-IGBT conducting state is determined.

Figure 8:
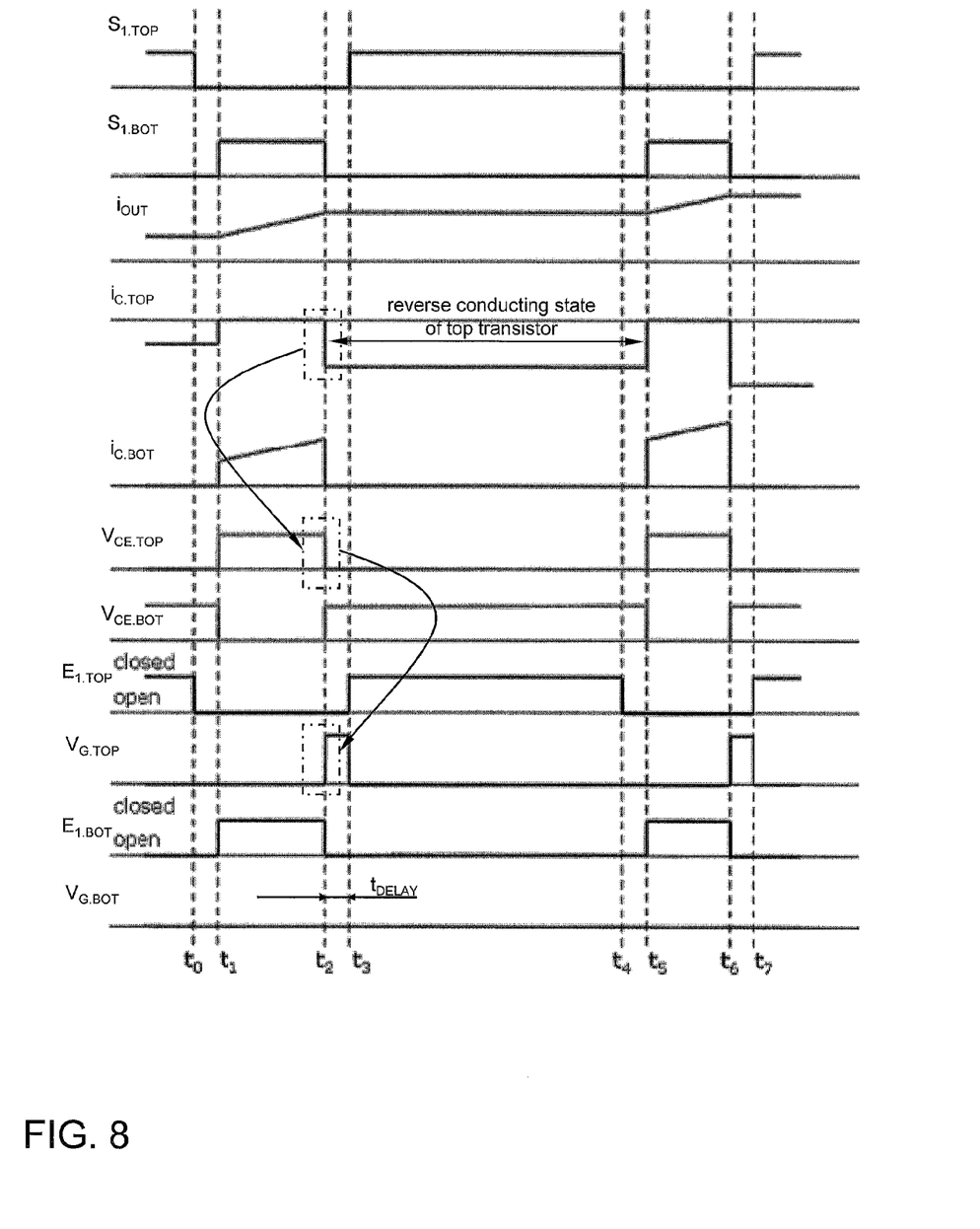
FIG. 8 illustrates the schematic time response of control signals, currents, and voltages of the inverter half-bridge in FIG. 1 and the circuit arrangement in FIG. 7.

In FIG. 8 is a timing diagram depicting the time response of signals, voltages, and currents in an inverter half-bridge such as illustrated in FIG. 1 with a gate control unit 10, each half-bridge RC-IGBT ($T_{1BOT}$, $T_{1TOP}$) comprising a gate driver circuit arrangement according to FIG. 7, where the transistor $T_1$ may be a high side transistor ($T_{1TOP}$) or a low side transistor ($T_{1BOT}$).

The time responses of the control signals $S_{1BOT}$ and $S_{1TOP}$ are depicted in FIG. 8, where a high-signal means "turn-on transistor" and a low-signal means "turn-off transistor". Assuming a positive load current $i_{OUT}$ (referring to the load current direction indicated in FIG. 1), the top transistor $T_{1TOP}$ will be in its reverse conducting state, as soon as the bottom transistor $T_{1BOT}$ is turned off by its control signal $S_{1BOT}$. For a negative load current direction $i_{OUT}$ (again referring to the direction indicated in FIG. 1), the same coherences are valid, but the designator "top" and "bottom" is to be exchanged.

It can be seen from FIG. 8 that a turn-off command of the bottom transistor $T_{1BOT}$ (i.e. at time instants $t_2$ or $t_6$) initiates the reverse conducting state of the top transistor $T_{1TOP}$. In practice a dead time or delay time $t_{DELAY}$ between, for example, the time instants $t_2$ and $t_3$ or $t_6$ and $t_7$, is inevitable, meaning that neither control signal $S_{1TOP}$ or $S_{1BOT}$ is high and that neither transistor $T_{1TOP}$ or $T_{1BOT}$ is turned on via its gate electrode G, so as to avoid shoot-throughs. At the instants $t_3$ or $t_7$ the dead time $t_{DELAY}$ has elapsed and the control signal $S_{1TOP}$ of the reverse conducting top transistor $T_{1TOP}$ switches to a high level. As explained hereinbefore, the low-high transition of the control signal $S_1$ ($S_{1TOP}$ or $S_{1BOT}$) of a currently reverse conducting RC-IGBT $T_1$ ($T_{1TOP}$ or $T_{1BOT}$) should be prevented from switching on the transistor. Considering the inverter half-bridge in FIG. 1, this means that conducting state information concerning the conducting state of the corresponding RC-IGBT should be made available. Dependent on the conducting state information, a decision can be made whether to allow the gate control signal $S_1$ to switch on its corresponding transistor $T_1$, or whether to blank the control signal $S_1$.

It can further be seen from FIG. 8 that in case of a currently reverse conducting RC-IGBT (in the present case the top transistor $T_{1TOP}$) and an imminent low-high transition of the corresponding control signal (i.e. $S_{1TOP}$), its collector-emitter-voltage $V_{CE}$ is zero. In this case a $V_{CE}$ voltage transition from $V_{DC}$ (which is an idealized consideration) to zero, this transition is also referred to as $V_{CE}$ voltage dip, happened a dead time period earlier (i.e. $t_{DELAY} = t_3 - t_2 = t_7 - t_6$). The $V_{CE}$ voltage dip may be detected and used for generating a conducting state signal $S_{VR}$. As already indicated, the $V_{CE}$ voltage dip, in the present case across the collector-emitter path of the reverse conducting top transistor $T_{1TOP}$, causes a displacement current resulting in a respective gate current in the gate wire, as the charge changes in the parasitic capacitance $C_{GC}$. The dead time period $t_{DELAY}$ lies between the event of the $V_{CE}$ voltage dip and the very time instant the conducting state signal $S_{VR}$ must be available, whereby the dead time period commonly is long enough (i.e. $t_{DELAY} \geq 1$ μs) for electing the $V_{CE}$ voltage dip event and deriving a robust conducting state signal $S_{VR}$.

Considering FIG. 8, $E_{1TOP}$ is closed until the instant $t_0$ as $S_{1TOP}$ is high. Upon reaching the instant $t_0$, $E_{1TOP}$ is opened and $C_{GTOP}$ carries no charge. Upon the dead time (i.e. $t_{DELAY} = t_1 - t_0$) having elapsed at the instant $t_1$, the bottom IGBT $T_{1BOT}$ is switched on by its gate electrode ($S_{1BOT}$ undergoes a low-high transition at $t=t_1$). Switching on the bottom transistor $T_{1BOT}$ is enabled in this case as no reverse conducting state of $T_{1BOT}$ has been detected. Further, switching on the bottom transistor $T_{1BOT}$ causes the load current $i_{OUT}$ to commutate from the currently reverse conducting top transistor $T_{1TOP}$ into the now forward conducting bottom transistor $T_{1BOT}$. Subsequently, the collector-emitter voltage $V_{CETOP}$ across the top transistor increases from ideal zero to almost $V_{DC}$ (the DC-link voltage). Initiated by the increase of $V_{CETOP}$, the gate-collector capacitance of the top transistor $C_{GCTOP}$ is charged, the (displacement) current $i_{GATE}$ in this case passing through the gate resistance $R_G$ and the transistor D2 e.g. as shown in FIG. 7. As the gate current does not pass transistor M1, no charge is transferred to the sense capacitor $C_G$, and thus the voltage $V_{CG}$ across the sense capacitance $C_G$ remains zero.

Arriving at the time instant $t_2$, the gate control signal of the bottom transistor $T_{1BOT}$ switches to its low state and forces the gate electrode to switch off. Consequently, the load current $i_{OUT}$ instantaneously commutates into the top transistor $T_{1TOP}$. Prior to the top transistor passing into its reverse conducting state, the top collector-emitter voltage $V_{CETOP}$ drops from ideal $V_{DC}$ down to zero, causing the gate-collector capacitance $C_{GCTOP}$ of the top transistor to discharge resulting in gate current $i_{GATE}$ via the gate wire, the gate resistance $R_G$, the transistor D1, and the current mirror transistor M1. As such, the discharge current $i_{GATE}$ is mirrored by the current mirror transistor M2. Depending on the current mirror ratio n, the charge injected by the mirror current $i_{GATE}^* = n \cdot i_{GATE}$ into the sense capacitance $C_G$ is proportional to the charge originating from the gate-collector capacitance $C_{GCTOP}$ of the top transistor, as switch E1 is now open. Burdening the sense capacitance $C_G$ with a charge causes a voltage drop $V_{GTOP}$ which remains constant upon the switching transients having diminished. This means that if the collector-emitter voltage suddenly drops while the corresponding transistor passes into its reverse conducting state or has already passed into the reverse conducting state, the voltage $V_{GTOP}$ across the sense capacitance will almost immediately be increased by a displacement gate current caused by the collector-emitter voltage dip.

Progressing to time instant $t_3$, the gate control signal of the top transistor $S_{1TOP}$ switches to its high state. An appropriate (and commonly used) control circuit (which is not explicitly depicted in the accompanying Figures) is now used to combine the low-high transition of the gate control signal of the top transistor $S_{1TOP}$ with the voltage drop information across the sense capacitance $C_G$. If the voltage drop $V_G$ exceeds a certain threshold value, the gate control signal $S1_{BOT}$ is prevented from advancing to the gate electrode of the RC-IGBT in question (e.g. by means of the AND-gate in FIG. 4 and/or a particular embodiment of the gate driver unit 102).

The example provided hereinabove explains how the reverse conducting state of the top transistor $T_{1TOP}$ may be determined according to the present invention. The same principle is, of course, also valid vice versa, that is, if the conducting state of the bottom transistor of the inverter half-bridge $T_{1BOT}$ is to be determined.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit arrangement comprising:
   a reverse conducting IGBT configured to allow for conducting a load current in a forward direction and in a reverse direction, the IGBT having a load current path and a gate electrode;
   a gate control unit connected to the gate electrode and configured to activate or deactivate the IGBT by charging or, respectively, discharging the gate electrode in accordance with a gate control signal;
   a gate driver unit included in the gate control unit and configured to detect whether the IGBT conducts current in the forward direction or the reverse direction by sensing a gate current caused by a change of a voltage drop across the load path due to a changing of the reverse conducting IGBT into its reverse conducting state;
   wherein the gate control unit is further configured to deactivate the IGBT or to prevent an activation of the IGBT via its gate electrode when the gate driver unit detects that the IGBT is in its reverse conducting state.

2. The circuit arrangement according to claim 1, wherein the gate driver unit is configured to generate a conduction state signal from the sensed gate current, the conduction state signal indicating the conduction state of the reverse conducting IGBT.

3. The circuit arrangement according to claim 1, wherein the gate control unit is configured to process a current direction signal such that an activation of the reverse conducting IGBT via its gate electrode is prevented if the current direction signal indicates the reverse conducting IGBT is in its reverse conducting state.

4. The circuit arrangement according to claim 1, wherein the gate driver unit is supplied by a voltage source via a first and a second supply line, the gate driver unit comprises an output and an output line, and the gate driver unit output is configured to inject or receive a gate current into or from the gate electrode of the reverse conducting IGBT via the output line, the gate driver output current being the gate current.

5. The circuit arrangement according to claim 4, wherein a current-measuring device is arranged in the first supply line of the gate driver unit, or in the second supply line, or in the output line, or wherein a plurality of current-measuring devices are arranged in the first supply line of the gate driver, and/or in the second supply line, and/or in the output line.

6. The circuit arrangement according to claim 5, wherein the current-measuring devices comprise a shunt resistance and a parallel voltage-measuring device.

7. The circuit arrangement according to claim 4, wherein a voltage-measuring device is connected parallel to a gate resistance, the gate resistance being arranged in the gate driver output line.

8. The circuit arrangement according to claim 4, wherein a shunt resistance with a parallel voltage-measuring device is arranged in the output line.

9. The circuit arrangement according to claim 5, wherein the current-measuring device in the first and/or the second supply line comprises a current mirror having a first and a second current path.

10. The circuit arrangement according to claim 9, wherein the current mirror is arranged such that the current in its first current path is equal to the gate current, and the current mirror is configured such that the current in its second current path is equal or directly proportional to the current in its first current path.

11. The circuit arrangement according to claim 9, wherein a sense capacitance is arranged in the second current path of the current mirror to be charged by the current flowing in the second current path of the current mirror, and a charge quantity carried by the sense capacitance is a measure for the gate current.

12. A method for the detection of a forward or a reverse conducting state of a reverse conducting IGBT, the method comprising:
   providing a reverse conducting IGBT having a load path; and
   sensing a gate current caused by a change of a voltage drop across the load path due to a changing of the reverse conducting IGBT into its reverse conducting state.

13. The method according to claim 12, comprising:
   providing a conduction state signal indicating the conduction state of the reverse conducting IGBT;
   blocking a gate control signal for the reverse conducting IGBT if the conduction state signal indicates that the reverse conducting IGBT is in its reverse conduction state.

14. The method according to claim 12, comprising:
   charging or discharging a sense capacitance by means of a current proportional or equal to the gate current;
   sensing a charge quantity carried by a capacitance, said charge quantity being representative of the gate current.

15. A circuit arrangement comprising:
   a field-effect transistor configured to allow for conducting a load current in a forward direction and in a reverse direction, the field-effect transistor having a load current path and a gate electrode;
   a gate control unit coupled to the gate electrode and configured to activate or deactivate the field-effect transistor by charging or, respectively, discharging the gate electrode in accordance with a gate control signal; and
   a monitoring unit configured to detect whether the field-effect transistor conducts current in the forward direction or the reverse direction by sensing a gate current caused by a change of direction of a voltage drop across the load path corresponding to a change of the direction of the load current.

16. A method for the detection of a forward or a reverse conducting state of a field-effect transistor, the method comprising:
   providing a field-effect transistor having a load path and configured to allow for conducting a load current in a forward direction and in a reverse direction; and
   sensing a gate current caused by a change of direction of a voltage drop across the load path corresponding to a change of the direction of the load current.

17. A circuit arrangement comprising:
   a half-bridge switching circuit comprising two reverse conducting insulated gate bipolar transistors (RC-IGBTs) configured to allow for conducting a load current in a forward direction and in a reverse direction, the RC-IGBTs having a load current path and a gate electrode and a common circuit node of the two RC-IGBTs being a half-bridge output configured to provide an output current;
   a gate control unit for each RC-IGBT that is connected to the respective gate electrode and configured to activate or deactivate the respective RC-IGBT by charging or, respectively, discharging the gate electrode in accordance with a gate control signal received by the gate control unit;

at least one of the gate control units including a gate driver unit configured to detect whether the RC-IGBT conducts current in the reverse direction by sensing a gate current caused by a change of a voltage drop across the load path of the respective RC-IGBT due to a changing of the RC-IGBT into its reverse conducting state.

* * * * *